United States Patent
David et al.

(10) Patent No.: US 6,265,068 B1
(45) Date of Patent: *Jul. 24, 2001

(54) DIAMOND-LIKE CARBON COATINGS ON INORGANIC PHOSPHORS

(75) Inventors: Moses M. David; Dee Lynn Johnson, both of Woodbury, MN (US)

(73) Assignee: 3M Innovative Properties Company, St. Paul, MN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/978,716

(22) Filed: Nov. 26, 1997

(51) Int. Cl.$^7$ .............. B32B 5/16; B32B 27/02; C09K 11/02; B05D 7/00

(52) U.S. Cl. .......... 428/403; 428/407; 428/408; 428/917; 252/301.36; 252/301.65; 252/301.45; 427/212; 427/214; 427/215; 427/220

(58) Field of Search ............ 428/403, 407, 428/408, 917, 690; 252/301.36, 301.65, 301.45; 427/212, 214, 215, 220

(56) References Cited

U.S. PATENT DOCUMENTS

| | | | |
|---|---|---|---|
| 4,219,587 | * 8/1980 | Oba et al. | 427/64 |
| 4,806,246 | 2/1989 | Nomura | 210/651 |
| 4,859,493 | 8/1989 | Lemelson | 427/45.1 |
| 5,073,785 | * 12/1991 | Jansen et al. | 346/1.1 |
| 5,156,885 | 10/1992 | Budd | 427/70 |
| 5,234,529 | 8/1993 | Johnson | 156/345 |
| 5,418,062 | 5/1995 | Budd | 428/403 |
| 5,439,705 | 8/1995 | Budd | 427/212 |
| 5,556,521 | 9/1996 | Ghanbari | 204/192.32 |
| 5,583,393 | * 12/1996 | Jones | 313/495 |

FOREIGN PATENT DOCUMENTS

| | | |
|---|---|---|
| 41 22 834 A1 | 1/1993 | (DE) . |
| 361 542 A1 | 12/1986 | (EP) . |
| 0 448 227 A | 9/1991 | (EP) . |
| 2 760 755 A | 9/1998 | (FR) . |
| 59-137311 | 8/1984 | (JP) . |
| 63-270394 | 11/1988 | (JP) . |
| 02 040953 A | 2/1991 | (JP) . |
| 4-304290 | 10/1992 | (JP) . |
| 6-184533 | 7/1994 | (JP) . |
| 6-299146 | 10/1994 | (JP) . |
| 8-176540 | 7/1996 | (JP) . |
| 8-3199483 | 12/1996 | (JP) . |
| WO 97 46484 a | 12/1997 | (WO) . |
| WO 98/20185 | 5/1998 | (WO) . |

OTHER PUBLICATIONS

Silva, S.R.P., et al., "Diamond–Like Carbon Thin film Deposition Using a Magnetically Confined R.F. PECVD System", Diamond and Related Materials, vol. 4, No. 7, May 15, 1995, p. 997–983.

David M., Padiyath, R., Babu, S.V., Plasma Deposition and Etching of Diamond–Like Carbon Films, vol. 37, No. 3 AICHE Journal (Mar., 1991) pp. 367–376.

Chia–Fu Chen et al, "Microwave Plasma Chemical Vapour Deposition of Diamond: Its growth and characterization",: Surface and Coatings Technology, vol. 43–44, No. 1–3, pp. 53–62, Dec. 5, 1990.

* cited by examiner

Primary Examiner—Paul Thibodeau
Assistant Examiner—Holly C. Rickman
(74) Attorney, Agent, or Firm—Melanie Gover

(57) ABSTRACT

Inorganic phosphor particles having a diamond-like carbon coating and the method of making these particles. Inorganic phosphor particles are coated with a diamond-like carbon coating, which can include additive components. The coating is applied in a plasma reactor process.

4 Claims, 6 Drawing Sheets

CURVE A ○—○
CURVE B ◇—◇
CURVE C △—△
CURVE D ●—●

DIAMOND-LIKE CARBON COATINGS ON INORGANIC PHOSPHORS

TECHNICAL FIELD

This invention relates to inorganic phosphors. In particular, this invention relates to inorganic phosphors having a diamond-like carbon coating and to the method of making these diamond-like carbon-coated inorganic phosphors.

BACKGROUND ART

Phosphor particles are used in a variety of applications such as flat panel displays and decorations, cathode ray tubes, and fluorescent lighting fixtures. Luminescence or light emission by phosphor particles may be stimulated by the application of heat (thermoluminescence), light (photoluminescence), high energy radiation (e.g., x-rays or e-beams), or electric fields (electroluminescence).

Electroluminescent inorganic phosphors are of particular commercial importance. They are used in electroluminescent lamps, which in turn are used in, e.g., watches, clocks, and communication devices. The luminescent brightness and maintenance of the brightness of such inorganic phosphors are two important criteria for characterizing phosphor particles. Inorganic phosphors are subject to degradation which causes them to lose their brightness, and thus shortens their lifetime. Luminescent brightness is typically reported as a quantity of light emitted by the subject phosphor when excited. When reporting brightness (also referred to as luminosity), the conditions under which the phosphor is excited should also be reported. This is because the value depends on several factors including the voltage and frequency of the applied electric field and the temperature which the phosphor experiences. Maintenance refers to the rate at which inorganic phosphors lose brightness during operation. Water vapor is one of the most important adverse influences on maintenance. The effect of moisture or high humidity is referred to herein as humidity accelerated decay.

One way to protect inorganic phosphors and slow the rate of humidity accelerated decay is to encapsulate them with inorganic coatings, e.g., oxide coatings. Such coatings are generally transparent in order to prevent the loss of light emission by the inorganic phosphors and comprise oxides such as silica, titania, alumina, and mixtures of these. These coatings have been deposited by chemical vapor deposition onto phosphor particles in a fluidized bed. U.S. Pat. Nos. 5,156, 885, 5,418,062 and 5,439,705 (Budd) describe encapsulated electroluminescent inorganic phosphors which exhibit high initial luminescent brightness coupled with resistance to humidity-accelerated decay.

DISCLOSURE OF THE INVENTION

Although there have been advances in the art of coated phosphor particles, there is still room to improve the lifetime and luminescent brightness of inorganic phosphors, particularly in humid environments. The deposition of diamond-like carbon coatings onto phosphor particles to achieve this objective has not previously been demonstrated.

In one aspect, this invention is an inorganic phosphor particle, wherein a diamond-like carbon coating is on at least a portion of the surface.

In a preferred embodiment, the inorganic phosphor particle further comprises a transparent layer of one or more organic or inorganic materials between the particle surface and the diamond-like carbon coating.

In another aspect, this invention is a method of coating diamond-like carbon onto inorganic phosphor particles comprising:

providing a multiplicity of inorganic phosphor particles;

forming a plasma from a carbon-containing source comprising reactive species in proximity to the multiplicity of inorganic phosphor particles;

exposing the multiplicity of particles to the reactive species in the plasma;

whereby deposition of diamond-like carbon onto at least a portion of the surface of the inorganic phosphor particles occurs.

In a preferred method, energy is capacitively coupled into the plasma.

In a most preferred method, the conditions present in the capacitively coupled system further comprise an ion sheath.

As used in this application, "diamond-like carbon" refers to an amorphous film or coating comprising approximately 50 to 90 atomic percent carbon and approximately 10 to 50 atomic percent hydrogen, with a gram atom density of between approximately 0.20 and approximately 0.28 gram atoms per cubic centimeter, and composed of approximately 50 to approximately 90% tetrahedral bonds.

As used in this application, "amorphous" means a randomly-ordered non-crystalline material having no x-ray diffraction peaks.

As described herein, the present invention has several advantages. The present inventors have found that diamond-like carbon coated onto inorganic phosphors, and particularly onto oxide-coated inorganic phosphors, imparts a high initial luminescent brightness and surprisingly high resistance to humidity accelerated decay. Diamond-like carbon coatings are desirable because they provide both chemical and mechanical protection to a substrate. DLC-coated inorganic phosphor particles are useful because they resist degradation at elevated temperatures and humidity. Electroluminescent lamps made with DLC-coated inorganic phosphor particles maintain a higher level of brightness, or luminosity, over longer periods of time than similar lamps made with oxide(only)-coated phosphor particles. Comparisons have shown a six-fold improvement in Time to Half-Life of the DLC-coated inorganic phosphors over oxide (only)-coated inorganic phosphor particles.

The methods disclosed, in particular the preferred methods, provide a fast and efficient process for depositing densely-packed diamond like carbon coatings onto inorganic phosphor particles.

Other advantages of the invention will be apparent from the following description, figures, examples, and appended claims.

DETAILED DESCRIPTION

Figure 1:
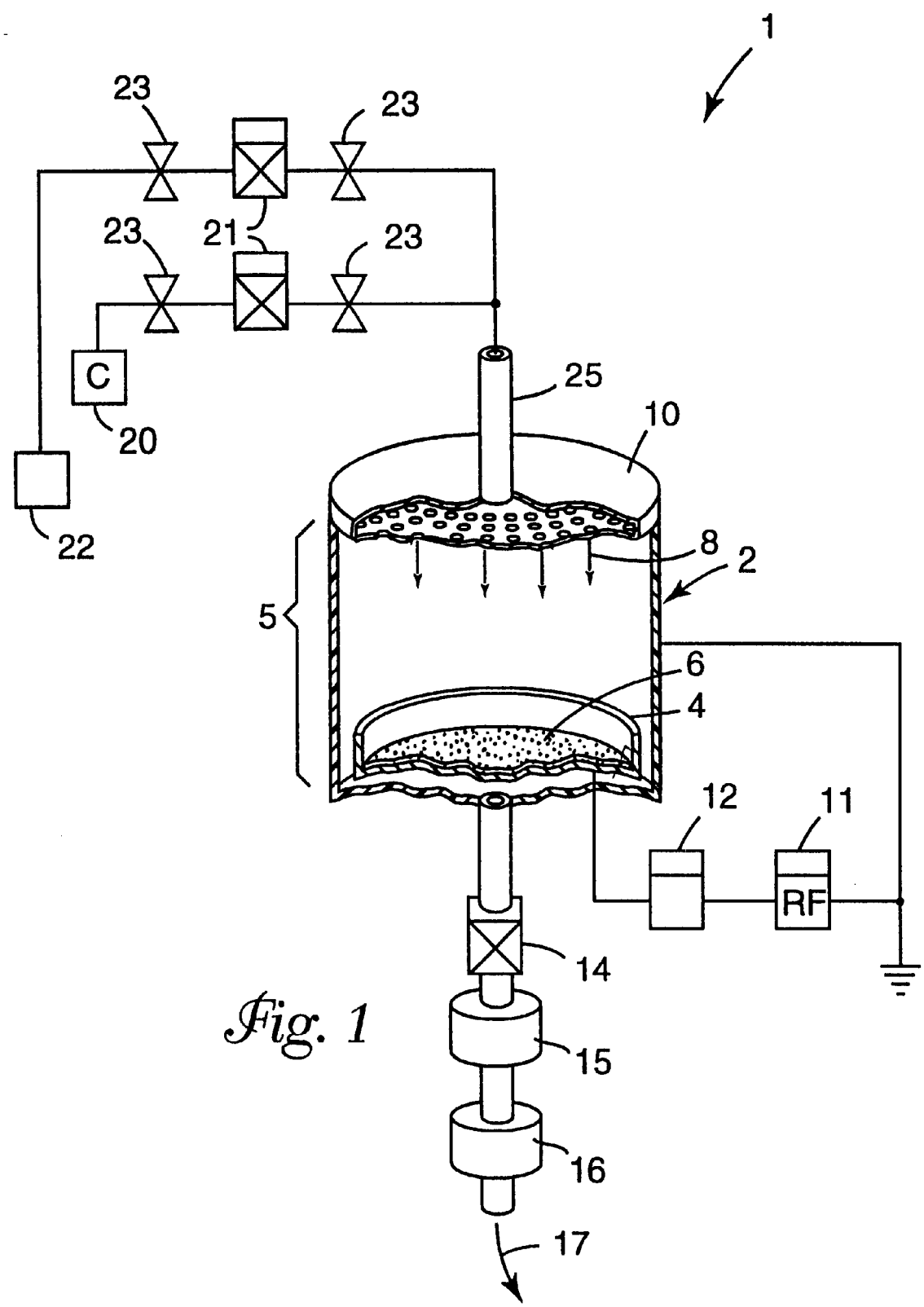
FIG. 1 is an illustrative diagram of an embodiment of the coating method of this invention.

Per the present invention, a DLC coating is deposited on at least a portion of the surface of the inorganic phosphor particle. Preferably, a DLC coating is deposited over a substantial portion of the inorganic phosphor particle. In a more preferred embodiment, the inorganic phosphor particle has been coated with a transparent organic or inorganic layer, and the DLC coating substantially covers the transparent layer. Most preferably, the DLC coating is uniform. A uniform coating is one which has a uniform thickness and composition and is free of major defects such as discontinuities. A uniform coating produces better humidity resistance than a non-uniform coating. The thickness of the DLC coating preferably ranges from about 1 to 1000 nanometers (about 10 Angstroms (A) to 10,000 A). The DLC coating is substantially transparent to visible light.

Inorganic phosphor particles have previously been coated with inorganic coatings such as oxides and nitrides which increase resistance to moisture decay. However, due to the high surface energy of these inorganic coatings, they are hydrophilic and, therefore, still prone to wetting by liquid water which can promote humidity accelerated decay. DLC-coatings, on the other hand, are strongly hydrophobic and provide an excellent barrier to penetration by moisture.

Inorganic phosphor particles have also been coated with diamond thin films. Although one would expect the characteristics and structural properties of diamond and DLC to be similar, this is not the case. They differ significantly due to the arrangement of carbon atoms in the specific material. Carbon coatings contain substantially two types of carbon—carbon bonds: trigonal graphite bonds ($sp^2$) and tetrahedral diamond bonds ($sp^3$). Diamond is composed of virtually all tetrahedral bonds, DLC is composed of approximately 50 to 90% tetrahedral bonds, and graphite is composed of virtually all trigonal bonds. The type and amount of bonds are determined from infrared (IR) and nuclear magnetic resonance (NMR) spectra.

The crystallinity and the nature of the bonding of the carbon determine the physical and chemical properties of the coating. Diamond is crystalline whereas DLC is a non-crystalline amorphous material, as determined by x-ray diffraction. DLC contains a substantial amount of hydrogen (from 10 to 50 atomic percent), unlike diamond which is essentially pure carbon. Atomic percentages are determined by combustion analysis.

Diamond has the highest packing, or gram atom, density (GAD) of any material at ambient pressure. Its GAD is 0.28 gram atoms/cc. Diamond-like carbon has a GAD ranging from about 0.20 to 0.28 gram atoms/cc. In contrast, graphite has a GAD of 0.18 gram atoms/cc. The high packing density of DLC affords it excellent resistance to diffusion of liquid or gaseous materials. Gram atom density is calculated based on the weight measurement and thickness of a coating. "Gram atom" refers to the atomic weight of a material expressed in grams.

DLC coatings are diamond-like because, in addition to the foregoing physical properties that are similar to diamond, they have many of the desirable properties of diamond such as extreme hardness (1000 to 2000 $kg/mm^2$), high electrical resistivity ($10^9$ to $10^{13}$ ohm-cm), a low coefficient of friction (0.1), and optical transparency over a wide range of wavelengths (extinction coefficient of less than 0.1 in the 400 to 800 nanometer range).

However, diamond coatings have some properties which, in some applications, make them less beneficial as a coating than DLC. Diamond coatings are comprised of a grain structures, as determined by electron microscopy. The grain boundaries are a path for chemical attack and degradation of the coated phosphor particles. The amorphous DLC coatings do not have a grain structure, as determined by electron microscopy.

Diamond and DLC also have different light absorption characteristics. For example, diamond has no intrinsic fundamental absorption in the blue light range because its optical band gap is 5.56 eV and it is transmissive well into the ultraviolet region. DLC, on the other hand, contains small amounts of unsaturated bonds due to carbon—carbon double bonding, which causes an optical absorption band in the blue region of the electromagnetic spectrum. Inorganic phosphor particles have primary light emission in the blue-green region of the electromagnetic spectrum. One would expect negligible visible light absorption from crystalline diamond coatings due to their high optical band gap. On the other hand, one would further expect the DLC optical absorption to interfere with light emission from the inorganic phosphor particles. However, notwithstanding the excellent light transmission characteristics of the diamond lattice, the polycrystalline structure of diamond coatings causes light scattering from the grain boundaries which can reduce luminosity of the inorganic phosphor particle. Surprisingly, the present inventors found that the amorphous DLC coatings allow for excellent light transmission despite their absorption of blue light. Additionally, the present inventors found that the visible light transmission of DLC may be further improved by incorporating silicon and oxygen atoms into the amorphous diamond-like carbon network during the deposition process. This is not possible for diamond thin films because additives will disrupt its crystalline lattice structure.

Various additives to the DLC coating can be used to alter and enhance the properties that the DLC coating imparts to the inorganic phosphor particles. These additives may comprise one or more of nitrogen, oxygen, fluorine, or silicon. For example, it may be desirable to further enhance the barrier properties. Decreasing the surface energy of the coating is thought to enhance these properties by increasing the hydrophobicity of the coating. It may also be desirable to enhance the ability of the DLC-coated inorganic phosphor particles to disperse in a matrix normally incompatible with the particles. Typically, the amounts of such additives range up to about 30 atomic percent of the DLC coating.

The addition of fluorine is particularly useful in enhancing barrier and surface properties, including dispersibility, of the DLC coating. Sources of fluorine include compounds such as carbon tetrafluoride ($CF_4$), sulfur hexafluoride ($SF_6$), $C_2F_6$, $C_3F_8$, and $C_4F_{10}$.

The addition of silicon and oxygen to the DLC coating tend to improve the optical transparency and thermal stability of the coating. The addition of nitrogen may be used to enhance resistance to oxidation and to increase electrical conductivity. Sources of oxygen include oxygen gas ($O_2$), water vapor, ethanol, and hydrogen peroxide. Sources of silicon preferably include silanes such as $SiH_4$, $Si_2H_6$, and hexamethyldisiloxane. Sources of nitrogen include nitrogen gas ($N_2$), ammonia ($NH_3$), and hydrazine ($N_2H_6$).

The additives may be incorporated into the diamond-like matrix or attached to the surface atomic layer. If the additives are incorporated into the diamond-like matrix they may cause perturbations in the density and/or structure, but the resulting material is essentially a densely packed network with diamond-like carbon characteristics (chemical inertness, hardness, barrier properties, etc.) If the additive concentration is large, i.e., greater than 50 atomic percent, relative to the carbon concentration, the density will be affected and the beneficial properties of the diamond-like carbon network will be lost. If the additives are attached to the surface atomic layers they will alter only the surface structure and properties. The bulk properties of the diamond-like carbon network will be preserved.

Inorganic phosphor particles suitable for use in this invention include fluorescent, phosphorescent, electroluminescent, and thermoluminescent inorganic phosphors based on a variety of metal sulfides, oxides, nitrides, and fluorides. These inorganic phosphors include, for example, zinc sulfide, zinc oxide, strontium sulfide, indium gallium nitride, aluminum gallium nitride, gallium nitride, and the like. Inorganic phosphor particles commonly contain other materials such as dopants (e.g., bromine, chlorine, manganese, copper, silver, zinc, cerium, and the like), color centers, activators, or materials that modify or introduce defects in the phosphor lattice. The particles may range in size from about 5 to about 20 micrometers, although larger sized particles can be used and milled to smaller particle sizes.

Preferred inorganic phosphor particles for use in this invention are electroluminescent inorganic phosphor particles. These inorganic phosphors commonly include one or more of such compounds as zinc sulfide (ZnS), copper sulfide (CuS), and cadmium sulfide (CdS) wherein the CuS or CdS are in solid solution within a ZnS crystal structure or are present as second phases or domains within the ZnS particle structure.

Preferably, the inorganic phosphor particles of this invention have been pre-coated with a transparent layer of organic or inorganic material or materials. The layer should be sufficiently transparent to allow for the transmission of light from the inorganic phosphor particle. The layer may be applied to alter such properties as surface energy, chemical resistance, adhesion characteristics, and the like. Useful organic layers include, for example, one or more of polymethylmethacrylate (PMMA), polysiloxane, polyvinylidene fluoride, and the like. Useful inorganic layers include oxide layers comprising metal cations and oxygen. These oxides include compounds and mixtures of compounds selected from the group of titania, titania/silica, silica, alumina, tin oxide, zirconia, and compound oxides such as mullite ($3Al_2O_3 \cdot 2SiO_2$). Preferably, at least a portion of the surface of the inorganic phosphor particle is coated with the transparent layer. More preferably, the transparent layer substantially covers the inorganic phosphor particle surface. The transparent layer can range in thickness from about 0.1 to about 3.0 micrometers, and preferably ranges in thickness from about 0.1 to about 0.5 micrometers.

The transparent layer can be deposited via chemical vapor deposition from vapor phase precursors such that the precursors react to form the transparent layer on the surface of the inorganic phosphor particles. A method to encapsulate inorganic phosphor particles with metal oxides is described in, for example, U.S. Pat. No. 5,439,705 (Budd), incorporated herein by reference.

Suitable oxide-coated inorganic phosphor particles are produced by Osram Sylvania of Towanda, Pa., and Durel Corporation of Chandler, Ariz.

Methods exist to deposit inorganic coatings and diamond films on inorganic phosphor particles, but these methods are unsuitable for the deposition of DLC on inorganic phosphor particles. U.S. Pat. No. 5,439,705 (Budd) describes a method of chemical vapor deposition to deposit oxide coatings on phosphor particles. Japanese Kokai Patent Application No. HEI 4[1992]-304290 describes the use of a microwave plasma process to deposit a diamond thin-film onto the surface of phosphor particles in a continuous process.

The conditions necessary for chemical vapor deposition (CVD) of oxide coatings do not include plasma, which is required for the deposition of DLC. The chemical vapor deposition techniques also do not form ionic species, which are necessary for the deposition of DLC. Further, CVD is an equilibrium process which generates equilibrium phases. DLC is a non-equilibrium phase.

The conditions required for diamond thin-film deposition can be detrimental to phosphor particles. The process for diamond film deposition uses deposition pressures of 1.33–13.3 Pa (10–100 Torr) and deposition temperatures of 90–900° C. (preferably 700–800° C.). The high temperatures required for depositing diamond can degrade inorganic phosphor particles. Further, diamond deposition requires a flux of atomic hydrogen to form the crystalline structure. The immense atomic hydrogen flux during deposition can passivate the phosphor particle and deplete the surface of sulfur. Also, hydrogen recombination at the film growth surface generates large amounts of heat which can cause thermal degradation of the phosphor.

Additionally, the process used for diamond thin-film deposition is substantially different from, and not suitable for, the deposition of DLC coatings. In the process for making diamond film, atomic hydrogen is present in the gas phase. This atomic hydrogen in the diamond-making plasma will etch DLC instead of depositing it as a thin film. In contrast, during the DLC formation process, there is virtually no atomic hydrogen present in the gas phase, although the DLC film itself contains hydrogen. The presence of the bonded hydrogen within the DLC film promotes the formation of tetrahedral bonds, leading to an increase in the atomic packing density. Further, the diamond reactor configuration will not permit the formation of an ion sheath which is preferable for the deposition of DLC coatings, as is discussed further herein. Formation of an ion sheath and ion bombardment, which occur in the preferred methods of DLC deposition, will not produce or enhance diamond coatings.

In the method of this invention, diamond-like carbon (DLC) coatings are deposited onto inorganic phosphor particles from carbon-containing gases by plasma deposition. Deposition occurs at reduced pressures (relative to atmospheric pressure) and in a controlled environment. A carbon rich plasma is created in a reaction chamber by applying an electric field to a carbon-containing gas. Particles to be coated are held in a vessel or container in the reactor and may be agitated while in proximity to the plasma. Species within the plasma react on the inorganic phosphor particle surface to form covalent bonds, resulting in DLC on the surface of the particles. In a preferred method, a parallel plate reactor is used. This type of reactor generally has a powered electrode parallel to a grounded electrode which causes energy to be capacitively coupled into the plasma. Using a radio frequency power source further causes ion sheaths to form around the electrodes. Keeping the particles within an ion sheath results in faster deposition of a more densely packed DLC coating on the particles.

A multiplicity of particles is coated during the process of this invention. "Multiplicity" refers to more than one particle. Typically at least many thousands of particles are coated at the same time during this process. The quantity to be coated depends upon the size and configuration of the reaction chamber as well as the desired agitation means.

The inorganic phosphor particles are held in a vessel or container within an evacuable chamber. Preferably, the particles are agitated within the reaction chamber in order to expose the entire surface of each particle to the reactive species from the plasma. Useful methods for agitating the inorganic phosphor particles include shaking, vibrating, or rotating the container, stirring the particles, or suspending them in a fluidized or spouted bed. Variable magnetic fields can also be used to agitate the particles.

Suitable containers for the particles include vibrating trays or reaction chambers fitted with a suitable porous material, such as a quartz or glass frit, through which gases may flow to cause agitation of the particles. It is possible to use more than one agitation method during the coating process; the important factor is that essentially the entire surface of each particle are exposed to the coating flux from the plasma and that the particles and reaction precursors are well intermixed. Preferred methods of agitating the particles in the practice of this invention include fluidized beds, spouted beds, and vibrating trays.

In some cases, the container holding the particles is the evacuable chamber, as for a fluidized or spouted bed arrangement. Hence the container may be referred to as a reactor or reaction chamber. The chamber is evacuated to remove air and any impurities. Inert gases (such as argon) may be admitted into the chamber to alter pressure and/or to assist in fluidization of particles.

It is convenient to use a fluidized bed to agitate the particles; in this case, particles are held on a porous material through which gases (e.g., inert gases such as argon and/or a reactant gases) can flow and cause the particles to fluidize. Typically when the particles are fluidized they rise up into the region of the plasma and deposition occurs. Such is depicted, for example, in FIG. 3. A similar arrangement may be used for a "spouted" bed, but here the particles are not coincident with the plasma. A spouted bed is a type of fluidized bed that requires lower gas velocities than does a steady-state fluidized bed. In a spouted bed, as gas pockets form and rise to the surface, agitation and fluidization occur periodically in spurts, similar to a liquid that is just beginning to boil. This is in contrast to the continuous agitation and fluidization that occurs in a fluidized bed, similar to a fluid at a full boil. The particles are in proximity to the plasma so that coating occurs upon diffusion of reactive species from the plasma. A spouted bed arrangement is depicted, for example, in FIG. 4.

Once the particles are placed in the chamber and it is evacuated, a substance containing carbon, preferably a gas (such as a hydrocarbon gas), is admitted. The gas forms a plasma upon application of an electric field. At the pressures and temperatures of DLC deposition (typically 0.13 Pa to 130 Pa (0.001 to 1.0 Torr) (all pressures reported herein are gauge pressures) and less than 50° C.), the carbon-containing material will be in its vapor form. Plasma refers to a partially ionized gaseous or fluid state of matter containing electrons, ions, neutral molecules, free radicals, and/or other excited state atoms and molecules. Visible light and other radiation are emitted from the plasma as the species comprising the plasma relax from various excited states to lower, or ground, states.

Figure 3:
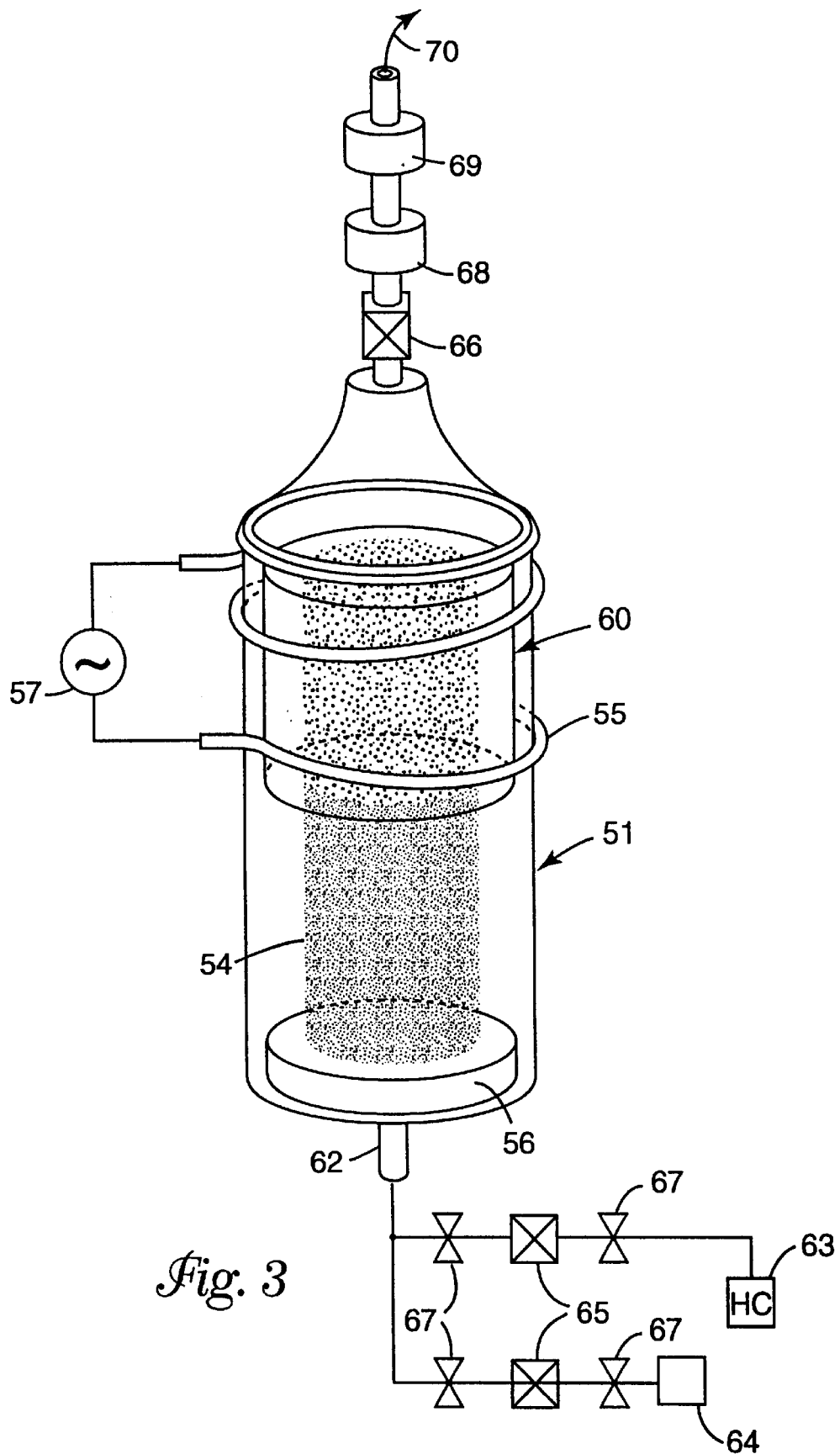
FIG. 3 is an illustrative diagram of a third embodiment of the coating method of this invention.

Within the reaction chamber, the plasma is formed in proximity to the particles. In a plasma reactor, "in proximity" means that the distance between the main plasma region and the inorganic phosphor particles is sufficiently short so that deposition can occur by diffusion of reactive species from the plasma onto the particles. The reactor dimensions as well as reaction pressures effect the diffusion distance. For example, when the pressure in a plasma deposition system is in the range of about 1.3 Pa (0.01 Torr) to about 130 Pa (1.0 Torr) and the size of the reactor is approximately 10.2 cm inner diameter and 61 cm high., the diffusion distance may range approximately from 5 to 20 cm, (2 to 8 inches). Such a configuration is illustrated, for example, in FIG. 4. Alternatively, "in proximity" refers to a reaction chamber in which the oxide-coated particles are coincident with the plasma region. This arrangement is illustrated in FIGS. 3 and 5, for example.

Hydrocarbons are particularly preferred gases for forming the plasma; such include acetylene, methane, butadiene, benzene, methylcyclopentadiene, pentadiene, styrene, naphthalene, and azulene. Mixtures of these hydrocarbons may also be used. Gases with low ionization potentials, i.e., 10 eV or less, preferably are used for efficient deposition of the DLC.

Although a variety of power sources may be used to form the plasma, such as direct current (DC), microwave (MW), pulsed DC and pulsed MW, it is preferred to form the plasma by applying a high frequency electric field to the carbon-containing material. Radio frequency (RF) power is preferred. In an RF-generated plasma, energy is coupled into the plasma through excitation of electrons. For this invention, an RF power source is used to supply a frequency in the range of 0.001 to 100 MHz. The RF power source can be an RF generator such as a 13.56 MHz oscillator.

Those of skill in the art recognize various reactor configurations for accomplishing plasma deposition of DLC on a planar substrate. The inventors found that these reaction configurations could be modified for deposition of DLC onto particles. Two types of reactors that may be used for DLC deposition are: inductively coupled plasma reactors, typically in which a solenoid is wrapped around a cylindrical reactor; and capacitively coupled plasma reactors, typically in which parallel electrodes are located in the reaction chamber. Contrary to expectations based on the mechanistic differences between depositing DLC on a planar substrate and on particles, the present inventors found that a capacitively coupled parallel plate reactor can produce excellent deposition results. Other configurations may also work.

In an inductively coupled reactor, the evacuable chamber is typically a cylindrical reaction chamber. A solenoid coil encircles the reaction chamber. A power source connects to the solenoid coil. Preferably an RF power source is used and supplies a frequency in the range of 0.001 to 100 MHz. Upon application of power, a plasma is formed in the reaction chamber in the region of the solenoid. Magnetic fields, created by the solenoid carrying the RF current, energize the plasma. In this mode, i.e., inductively coupled, the resulting plasma densities tend to be high and may result in thermal damage to the inorganic phosphor particles.

For planar substrates, capacitive coupling is preferable because it results in increased ion bombardment which causes densification, i.e., dense packing, of the DLC coating. While DLC deposition can be achieved without ion bombardment, ion bombardment is preferred to produce a densely-packed DLC coating. Capacitive coupling is best accomplished using a parallel plate reactor configuration connecting RF voltage to the powered electrode and grounding the remaining electrode, with the plasma acting as a charge carrier between the electrodes. The most preferred method uses an "asymmetric" parallel plate reactor in which the grounded electrode has two to four times the surface area of the powered electrode and comprises the grounded reaction chamber. (The powered electrode need not be the smaller electrode in an asymmetric reactor, but this configuration is generally preferred.)

Based on the physical aspects attending the deposition of DLC on planar substrates, a parallel plate reactor system was not expected to work well for particles. For planar substrates, deposition of dense diamond-like carbon thin films is achieved by using an asymmetric configuration and placing the substrates in direct contact with the powered electrode, which has a smaller surface area than the grounded electrode. This allows the substrate to act as an electrode due to capacitive coupling between the powered electrode and the substrate. This is described in M. M. David, et al., *Plasma Deposition and Etching of Diamond-Like Carbon Films*, AIChE Journal, vol. 37, No. 3, p. 367 (1991), incorporated herein by reference. It has been observed that when the substrate was moved away from the powered electrode, the resultant coating was not dense and took a long time to be deposited. It is believed that as the substrate moves away from the powered electrode it moves out of the range of the capacitive coupling effect and loses its ability to act as an electrode. The very nature of particles in a particle bed, e.g., their non-planar geometry, their loosely-packed configuration, and the voids that form and disappear in a fluidized bed, would create the expectation that capacitive coupling between the powered electrode and the multiplicity of particles could not occur with a particle bed. One would expect the electrical continuity between the powered electrode and the particles to be lost.

Surprisingly, the benefits of a parallel plate capacitive coupling system, similar to that described above for planar substrates, were realized when used with a particle bed. High rates of deposition were achieved even though individual particles were not in constant contact with the powered electrode. It is believed that the charge from the powered electrode cascades through the particles, thus imparting the charge from the electrode to the individual particles.

Capacitive coupling can also be accomplished by adding a grounding strap to an inductively coupled system. The grounding strap can be wrapped around the reaction chamber to maintain an axial electric field in the reaction chamber, resulting in capacitive coupling of the plasma. This arrangement is depicted, for example, in FIG. 5. However, little if any ion bombardment is achieved with this configuration. DLC deposition by this method tends to be slow.

As previously stated, a preferred configuration for DLC deposition is a parallel plate reactor, in which one electrode is adjacent the multiplicity of particles and another electrode of similar size is positioned within the reaction chamber parallel to the first electrode. A more preferred method is to have one electrode, typically the RF powered electrode, with a surface area two to four times smaller than that of the other electrode, typically the grounded electrode. A variation of this configuration is to use the reaction chamber as the grounded electrode. This arrangement is depicted, for example, in FIGS. 1 and 2. The reaction chamber is typically cylindrical but may be of any shape. Regardless of the configuration of the grounded electrode, the RF energy supplied to the powered electrode from the power source is capacitively coupled into the plasma because of the parallel plate configuration.

In a parallel plate reactor using RF energy, the applied frequency should be in the range of 0.00 to 100 MHz, and is preferably a frequency of 13.56 MHz or any whole number multiple thereof. The RF power source can be connected to the powered electrode via a network that acts to match the impedance of the power supply with that of the transmission line and plasma load (which is usually about 50 ohms so as to effectively couple the RF power). Hence this is referred to as a matching network.

Those of skill in the art recognize that an RF powered parallel plate reactor produces a main plasma region and an ion sheath. Upon admission of carbon-containing gases into the reaction chamber and application of RF power to the powered electrode, a visible colored (the color depends on the gas) plasma cloud is established. A darker ion sheath forms around the electrodes. The ion sheath has a lower electron density than the main plasma region. This causes it to glow less than the main plasma region and appear to be a darker color. As the difference in surface area of the electrodes increases, the smaller electrode achieves a larger ion sheath and the larger electrode achieves a smaller ion sheath. In a typical asymmetric system, the ion sheath around the larger electrode is negligible. The ion sheath causes a significant amount of ion bombardment. The electric field in the ion sheath causes positively-charged ions from the main plasma region to accelerate and gain energy as they traverse the ion sheath. These ions then bombard the negatively charged inorganic phosphor particles located in the ion sheath. The bombardment causes densification of the carbon being deposited on the particle and results in formation of a densely-packed diamond-like carbon coating on the phosphor particle. It also increases the rate of deposition. An explanation of the formation of ion sheaths can be found in Brian Chapman, *Glow Discharge Processes*, 153 (John Wiley & Sons, New York 1980).

The ion sheath also causes negative self-biasing of the powered electrode relative to the plasma. The negative bias is typically in the range of 100 to 2000 volts. While the acceptable frequency range may be high enough to form a large negative direct current (DC) self bias on the powered electrode, it should not be high enough to create standing waves in the resulting plasma, which is inefficient for the deposition of a DLC coating.

Because deposition rates and densification of the DLC coating are maximized by the ion bombardment that occurs within the ion sheath, manipulating the conditions of the reaction chamber to keep the particles substantially within the ion sheath and to increase ion bombardment will optimize the deposition process. For example, using an asymmetric reactor configuration with electrode surface area ratios of up to 4:1 and/or reducing pressures in the reaction chamber will increase the size of the ion sheath and using a spouted bed or vibrating tray rather than a fluidized bed will minimize the volume of the agitated particles and keep them substantially within the ion sheath. Also, increasing the voltage across the ion sheath will increase ion bombardment.

Additive sources are typically introduced into the coating chamber in a vapor form during or after the deposition of DLC. The additive sources are fed into the reaction chamber by themselves or, especially in the case of a solid or liquid additive sources, are entrained in a carrier gas. The additives can be admitted during or after the DLC deposition, depending on the desired effect. If added during the DLC deposition, the additives will be incorporated into the diamond-like matrix and may alter the bulk properties of the DLC network. If added after the DLC deposition, the additive will attach in the surface atomic layers, altering only the surface structure and properties. For example, fluorine-containing compounds typically are introduced into the coating chamber after the flow of hydrocarbon-containing gas has been stopped. Thus, a fluorine-containing plasma bombards the DLC coating for a time sufficient to form covalent bonds between the fluorine and carbon in the DLC coating.

The Figures illustrate further detail of methods of preparing the DLC-coated inorganic phosphor particles of this invention.

FIG. 1 illustrates a method and apparatus for making DLC-coated inorganic phosphor particles. Coating system 1 comprises a planar electrode powered by RF and a grounded reaction chamber. The inorganic phosphor particles are placed on a vibrating tray to agitate the particles during DLC plasma deposition. Capacitive coupling of the RF generated plasma results in the formation of an ion sheath around the tray. An electric field sufficient to cause densification of the coating, generally greater than 20 volts, is established across the ion sheath. The presence of this electric field produces ion bombardment, and thus greater densification of the DLC coating, compared with those systems having no capacitive coupling.

Multiplicity of particles 6 is placed on an aluminum tray which serves as powered electrode 4. Other suitable conductive materials may be used for this electrode, and include, for example, stainless steel, copper, graphite, nickel, brass, and the like. A preferred electrode material is aluminum due to the ease of fabrication, low sputter yield, and low cost. Electrode 4 is vibrated by means of a pneumatic vibrator, ultrasonic vibrator, or electromechanical vibrator such as those available from McMaster-Carr Supply Co., Chicago Ill., e.g., Part No. 5802K11 (not shown). Powered electrode 4 is located in evacuable aluminum chamber 2 which is pumped by means of two vacuum pumps connected in series: roots blower 15, a type of pump available from Leybold Hareus, Export, Pa., Model No. WSU501, backed by mechanical vacuum pump 16, for example Model No. D-60 available from Leybold Hareus, Export, Pa., which produce exhaust stream 17. Aluminum is also a preferred chamber material because it has a low sputter yield, which means that very little contamination of the DLC coating occurs due to the chamber surfaces. However, other suitable materials, such as graphite or stainless steel, may be used.

Gate valve 14 serves to isolate chamber 2 from the pumps while venting chamber 2 to the atmosphere or to appropriate scrubbers (not shown). The desired process gases are supplied from their respective storage tanks (20 for hydrocarbon gas and 22 for other gases) through stainless steel inlet tube 25 to vacuum chamber 2. Pneumatic isolation valves 23 control the flow of gases. The flow rates of the gases are controlled by means of mass flow controllers 21. Stream of gas 8 is distributed uniformly throughout chamber 2 by means of perforated aluminum plate 10 (also known as the showerhead) which has holes of approximately 750 micron diameter and approximately 2 to 4 holes per square centimeter (5 to 10 holes per square inch). The showerhead may comprise other materials, typically machinable materials such as copper and stainless steel.

Upon loading the particles onto the aluminum tray serving as electrode 4, chamber 2 is closed and evacuated to a base pressure below 0.65 Pa (0.005 Torr). Evacuation of the chamber serves to remove oxygen and any other species which might result in contamination of the DLC coating. The desired gas (e.g., hydrocarbon-containing gas) is introduced into chamber 2 at a desired flow rate, which depends on the size of the reactor and the amount of particles in the reactor. Such flow rates must be sufficient to establish a suitable pressure at which to carry out plasma deposition, typically 0.13 Pa to 130 Pa (0.001 to 1.0 Torr). For a reactor that has an inner diameter of approximately 55 cm and a height of approximately 20 cm, the flow rates are typically between 50 and 500 standard cubic centimeters per minute (sccm) for a vibrating tray arrangement.

When the gas flow is stabilized, plasma is ignited in the chamber by activating power supply 11. Plasma is generated and sustained by means of power supply 11 (an RF generator operating at a frequency in the range of 0.001 to 100 MHz). To obtain efficient power coupling (i.e., wherein the reflected power is a small fraction of the incident power), the impedance of the plasma load is matched to power supply 11 by means of matching network 12 comprising two variable capacitors and an inductor and available from RF Power Products, Kresson, N.J., as Model No. AMN 3000. A description of such networks can be found in Brian Chapman, *Glow Discharge Processes*, 153 (John Wiley & Sons, New York 1980). Plasma region 5 forms throughout chamber 2. The plasma region has two areas: the main plasma region and the ion sheath. The ion sheath (not depicted) surrounds powered electrode 4 and is a region of high electric field. A pneumatic vibrator (not depicted) is attached to the powered electrode tray 4 and activated for the duration of the plasma treatment to agitate the particles.

The plasma is maintained for a time sufficient to deposit a diamond-like carbon-containing network of the desired thickness onto the particles. Typically such deposition times range from about 10 minutes to about 10 hours. If other additives are desired, another gas inlet system, similar to the combination of storage tank 20, mass flow controllers 21, and pneumatic isolation valves 23 can be connected to inlet tube 25.

Figure 2:
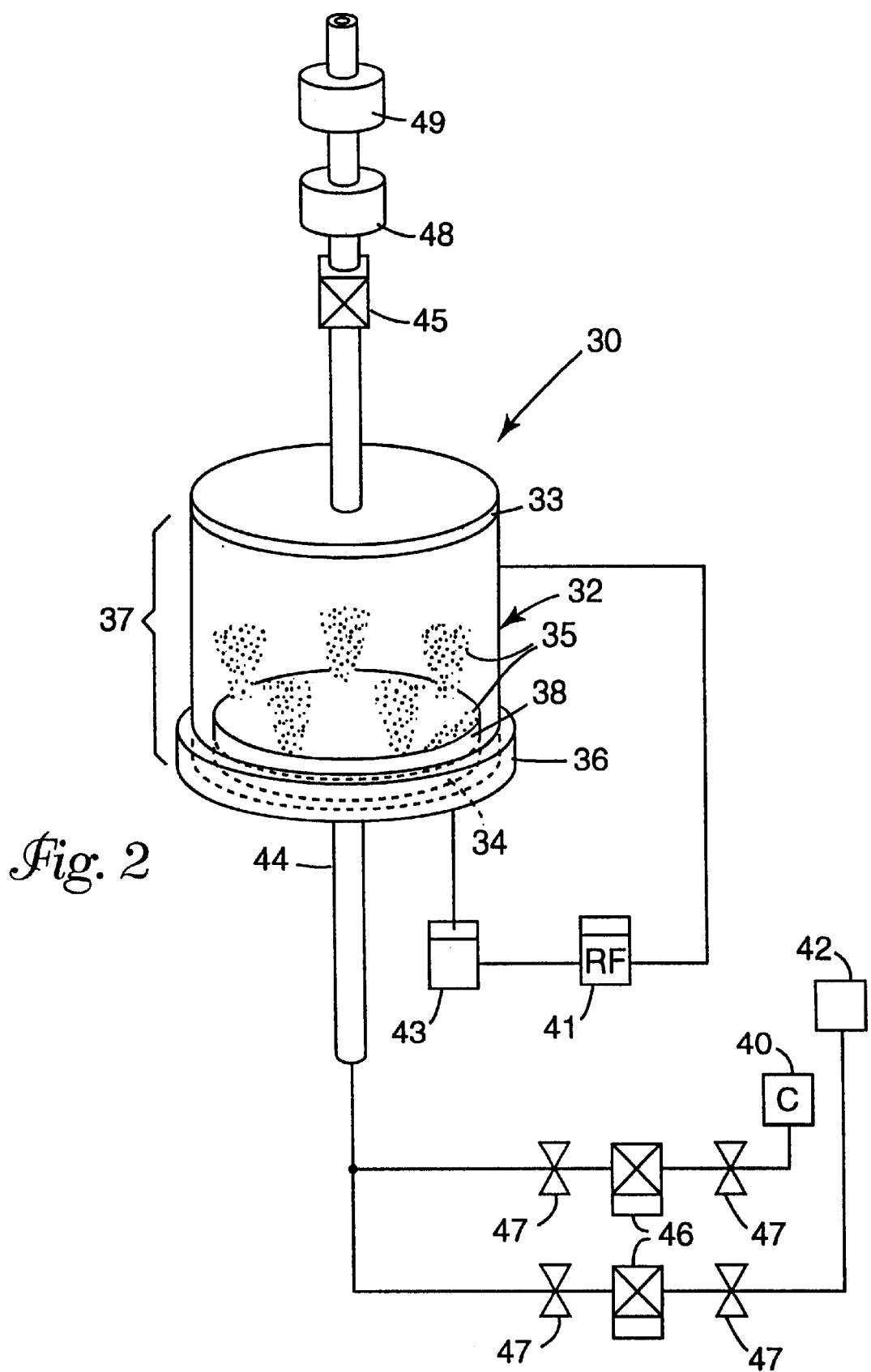
FIG. 2 is an illustrative diagram of a second embodiment of the coating method of this invention.

FIG. 2 illustrates yet another preparative method. This method shows coating system 30, another arrangement of a parallel plate reactor in which powered plate electrode 34 is located in evacuable aluminum chamber 32 which acts as the grounded electrode. The RF energy is capacitively coupled into the plasma due to the parallel plate configuration. Chamber 32 is connected to gas supplies 40 and 42 via appropriate mass flow controllers and pneumatic isolation valves. Chamber 32 is evacuated by means of two vacuum pumps: a roots blower 48 backed by mechanical pump 49 connected in series to chamber 32 through aluminum plate 33. Gate valve 45 serves to isolate chamber 32 from the pumps while venting the chamber. Insulation plate 36 holds electrode 34. Insulation plate 36 comprises an insulating material such as plastic; for example, polyetherimide (ULTEM™). Desired gases are supplied from their respective storage tanks 40 and 42 are admitted via inlet 44 beneath glass frit 38. Pneumatic isolation valves 47 control the flow of gases. The flow rates of the gases are controlled by means of mass flow controllers 46. The gases serve to agitate the particle bed by forming a spouted bed 35, which is similar to a steady-state fluidized bed except that the gas flow rates for a spouted bed are typically much lower than for a steady-state fluidized bed, consequently the particles do not occupy as large a volume of the reactor as with a fluidized bed. In a spouted bed, as gas pockets form and rise to the surface, agitation and fluidization occur periodically in spurts, similar to a liquid that is just beginning to boil. This is in contrast to the continuous agitation and fluidization that occurs in a steady-state fluidized bed, similar to a fluid at a full boil. A spouted bed allows the particles to remain in the ion sheath, rather than the main plasma region, while still undergoing good mixing. For a reaction chamber with an inner diameter of approximately 15.2 cm and a height of approximately 15.2 cm, typical gas flow rates for a spouted bed arrangement range from 100 to 500 sccm. Plasma is generated and sustained by means of power supply 41 (an RF generator operating at a frequency of 13.56 MHz) in plasma region 37. Densification of the DLC coating on the inorganic phosphor particles occurs within an ion sheath (not depicted) which forms around powered electrode 34. The impedence of the plasma load is matched to power supply 41 by means of matching network 43.

FIG. 3 illustrates another preparative method for the DLC-coated inorganic phosphor particles. In this method, the inorganic phosphor particles are uniformly coated with DLC by using a fluidized bed to agitate the particles. A multiplicity of inorganic phosphor particles 54 is placed on glass frit 56 within quartz tube 51. A solenoid 55 is wrapped around quartz tube 51 and is electrically connected to RF generator 57, resulting in an inductively coupled plasma. The desired process gases are supplied from their respective storage tanks (63 for carbon-containing gas and 64 for the optional additive precursor gas) via stainless steel inlet tube 62 to quartz tube 51 through glass frit 56. The flow rate of the gas is kept constant by means of mass flow controllers 65. Pneumatic isolation valves 67 control the flow of the gas. Reduced pressures are obtained by means of vacuum blower 68 backed by mechanical pump 69. After the pressure of the system has been reduced (typically to about 0.65 Pa (5 mTorr), carbon-containing gas is admitted to the chamber through inlet tube 62. The desired gas (i.e., inert gas, carbon-containing gas, and/or optional additive precursor gas) is introduced into the chamber at a desired flow rate to fluidize the multiplicity of inorganic phosphor particles 54. The flow rates typically range from about 100 to about 400 sccm for a reactor that has an inner diameter of 10.2 cm and a height of 61 cm. When the gas flow is stabilized, plasma is initiated in the chamber by activating power to RF generator 57 thus generating a plasma region 60. The fluidized particles 54 are coincident with the plasma region 60 thus producing faster deposition of DLC. The system is exhausted through exhaust line 70 to the atmosphere and/or to appropriate scrubbers (not shown). Because the particles are in the main plasma region which is intense due to inductive coupling, this method can cause thermal damage to the inorganic phosphor particles.

Figure 4:
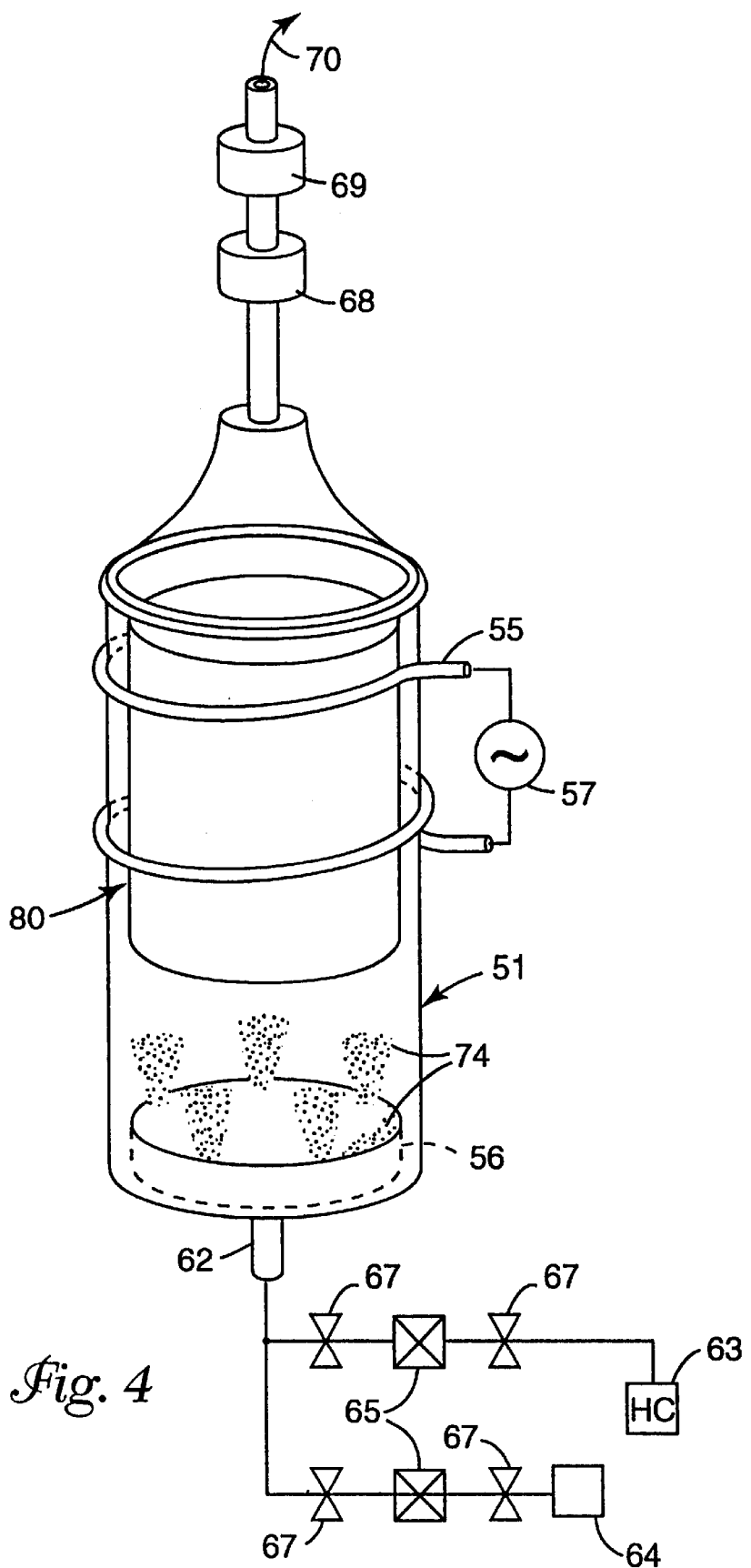
FIG. 4 is an illustrative diagram of a fourth embodiment of the coating method of this invention.
Figure 5:
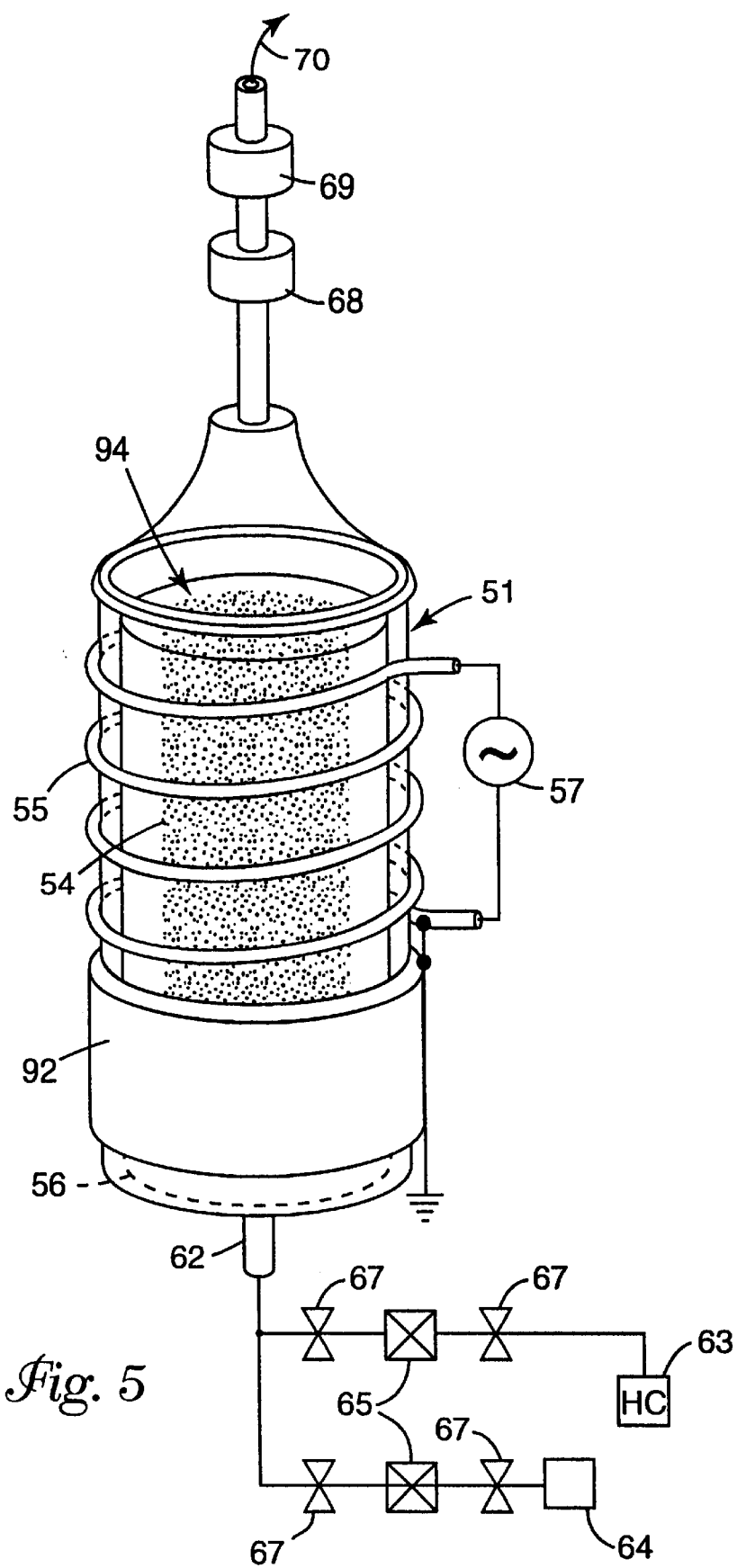
FIG. 5 is an illustrative diagram of a fifth embodiment of the coating method of this invention.

FIG. 4 illustrates yet another preparative method for the DLC-coated inorganic phosphor particles. This method is similar to the method depicted in FIG. 3, except that a spouted bed of inorganic phosphor particles is used. The particle bed 74 is placed on glass frit 56 and gas is passed into quartz tube via inlet line 62. Plasma region 80 forms above the particle bed. The gas flow rates for a spouted bed are typically much lower than for a fluidized bed, consequently the particles do not occupy as large a volume of the reactor as with a fluidized bed. The particles generally remain below the plasma region and are coated by means of diffusion of the reactive species from the plasma.

FIG. 5 illustrates yet another preparative method for the DLC-coated inorganic phosphor particles. This method is similar to the method depicted in FIG. 3, wherein particles 54 are placed on glass frit 56 within quartz tube 51, except that a grounding strap 92 is wrapped around quartz tube 51. The grounding strap maintains an axial electric field in the reaction chamber, resulting in capacitive coupling of the plasma. Grounding strap 92 creates an electric field along the longitudinal axis of quartz tube 51 thus producing extended plasma region 94, which extends from the portion of quartz tube 51 encircled by the solenoid into the area of tube 51 surrounded by grounding strap 92. In this type of extended plasma, thermal damage of particles 54 tends not to occur. In this arrangement, either a fluidized bed (as depicted) or a spouted bed (as described in FIG. 4) can be used; in either case, the inorganic phosphor particles 54 are coincident with plasma region 94 thus producing faster deposition of DLC.

Figure 6:
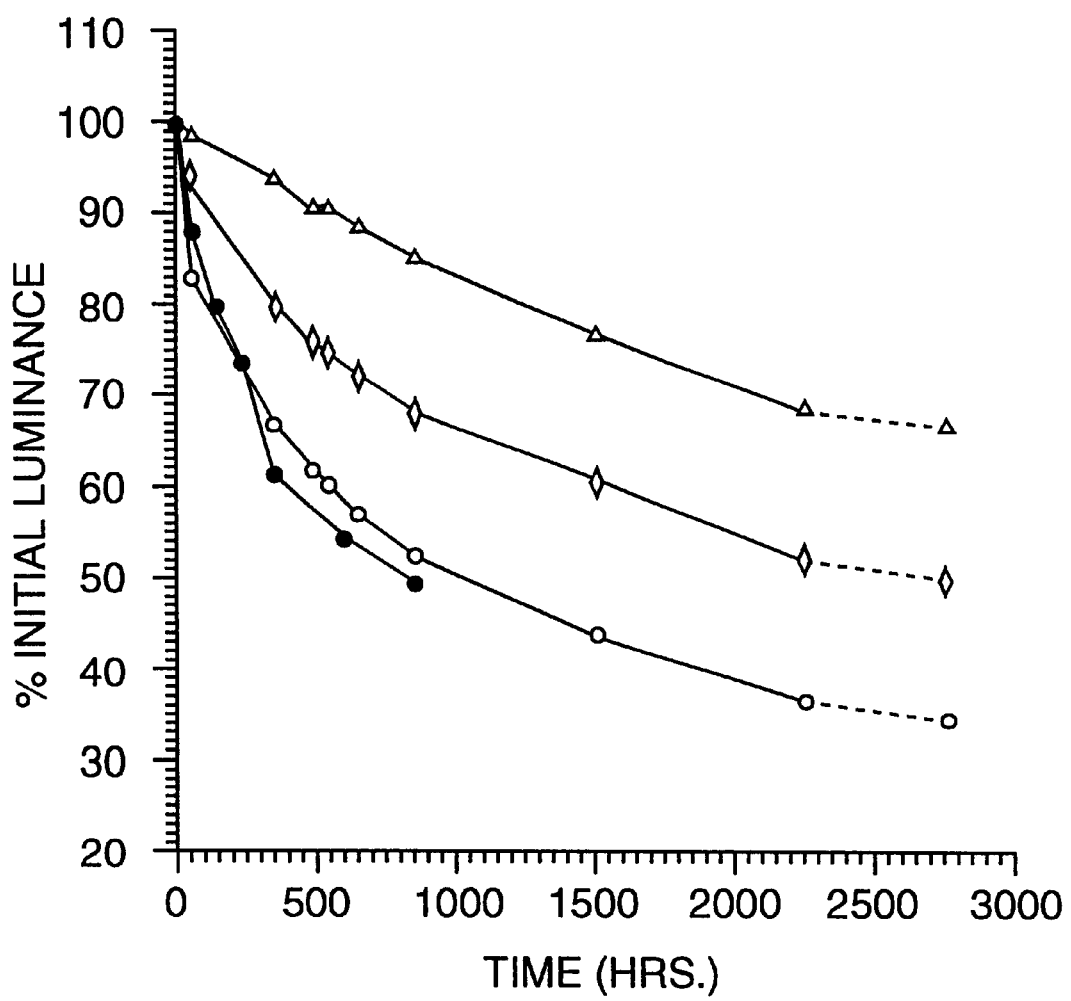
FIG. 6 is a graphical illustration of the time-dependent luminance decay for the DLC-coated oxide-coated inorganic phosphors of this invention and for oxide-coated inorganic phosphors.

FIG. 6 is a graphical illustration of the percent initial luminance of (1) DLC-coated oxide-coated inorganic phosphor particle lamps (curves A and B), as prepared according to Example 5, herein, (2) oxide-coated inorganic phosphor particle lamps, used as control data (curve C), and (3) archival data for the control lamps of curve C (curve D). Each data point on each curve was derived from the average of three measurements taken from a lamp comprising the appropriate type of phosphor particles. Testing was carried out at 23±4° C. and approximately 45 percent relative humidity. FIG. 6 is further discussed in Example 5.

The DLC-coated inorganic phosphor particles of this invention are useful in any application which uses inorganic phosphor particles. These include photoconductive inorganic phosphors (e.g., zinc oxide) and phosphorescent inorganic phosphors. Applications useful for the DLC-coated inorganic phosphor particles include photoconductive copier drums, phosphorescent signs, cathode ray tubes (CRT), light emitting diodes, laser diodes, field emission displays, fluorescent tubes, and X-ray intensifying screens. The coating is particularly useful on electroluminescent (EL) inorganic phosphor particles because devices using these particles are frequently exposed to heat and humidity. Thus the barrier properties imparted to EL inorganic phosphor particles by the DLC coating of this invention are particularly desirable. Devices which use EL inorganic phosphor particles include devices such as watches and clocks, automotive displays, and communication devices.

Because DLC-coated inorganic phosphors particles are particularly useful in EL lamps, testing was performed to determine the performance of the DLC-coated particles in EL lamps.

EXAMPLES

This invention may be illustrated by way of the following examples.

Test Methods
Electroluminescent Lamps: Temperature and Moisture Resistance

Lamp Construction

EL lamps are constructed of several layers, typically including a transparent front electrode, an inorganic phosphor layer, a dielectric layer, a rear electrode, and an insulator backing the rear electrode. These lamps are produced commercially by Durel Corporation of Chandler, Ariz.

In order to test the luminance and the decay lifetimes of the DLC-coated inorganic phosphor particles, electroluminescent (EL) lamps were prepared and tested by Durel Corporation using the DLC-coated inorganic phosphor particles supplied by the inventors. The inventors are informed and believe that Durel Corporation followed its standard procedure for making and testing the EL lamps as described in "Durel® 3 Electroluminescent System Product Selector Guide."

Testing Conditions and Results

The lamps were activated by means of a power supply of 115 volts at 400 Hz. Luminance readings were made at varying time intervals, as shown in FIG. 6, using a Radiometer (Model # PR-650 made by PhotoReasearch, Chatsworth, Calif.) over a 1 cm area of the lamp. From the luminance decay curve, time-to-half luminance (THL) was measured and reported.

Durel compared the initial luminance and THL values of lamps made with DLC-coated oxide inorganic phosphor particles to the initial luminance values of lamps made with inorganic phosphor particles coated with an oxide protective coating. The DLC-coated inorganic phosphor particles of this invention exhibited a six-fold increase in THL compared with the inorganic phosphor particles coated with oxide alone. (i.e., 6000 hours compared to about 1000 hours. See generally FIG. 6. Data taken beyond 3000 hours is not shown).

Resistance to Chemical Attack

Chemical resistance was determined by dispersing a small quantity (several grams) of DLC-coated inorganic phosphor particles in an aqueous 1.0 N silver nitrate solution. The relative resistance was determined according to the time taken to darken the inorganic phosphor particle from its normal yellowish-white color to a grayish-black color. The DLC-coated particles took approximately 5–10 hours to darken while uncoated particles took only 5 minutes to darken.

Hydrophobicity

The hydrophobic nature of the DLC-coated inorganic phosphor particles was observed by suspending the particles in water. The DLC-coated inorganic phosphor particles did not become wet but floated or agglomerated into clumps of particles. In contrast, uncoated and oxide(only)-coated inorganic phosphor particles became wet and dispersed in the water.

The surface energy of a surface is related to the hydrophobicity of that surface. A lower surface energy will cause a material to be more hydrophobic. This hydrophobicity can be measured by using the surface tension of water; or, more specifically, by measuring the angle formed by a drop of water in contact with a surface. Because this is difficult to measure on a single coated inorganic phosphor particle, DLC coated onto a planar substrate was used to obtain a measurement of contact angle. DLC was deposited onto a silicon wafer by the inventors under similar process conditions as described for the particles and the contact angle of water on the coated wafer was measured to be between about 70° and 80°. This indicates that the surface energy of the DLC-coated surfaces are low and thus the hydrophobicity of the DLC is high.

Coating Properties

The particles were examined under a scanning electron microscope which revealed that the DLC coatings were amorphous and had no grain structure. The hardness of the coatings was estimated based on mohs tests performed on silicon wafers subjected to a similar coating process. The DLC coatings on the silicon wafers exhibited a hardness of 7 to 8 on a scale of 10.

Example 1

This example illustrates the preparation of diamond-like carbon (DLC)-coated inorganic phosphor particles wherein the particles are placed on a vibrating tray in a capacitively coupled plasma reactor.

A commercial parallel-plate capacitively coupled plasma reactor (commercially available as Model 2480 from PlasmaTherm of St. Petersburg, Fla.) was used for the deposition of DLC. This reactor comprised a chamber containing a powered lower electrode and a grounded chamber electrode, materially as depicted in FIG. 1 except that the powered electrode comprised both aluminum tray 4 holding the particles and an aluminum plate that was beneath the tray and was attached to a power source. Because of the conductive nature of the aluminum tray, it acted as part of the electrode. About 50 grams of oxide-coated inorganic phosphor particles (obtained from Durel Corporation, Chandler, Ariz., as Type 729), having a 300 nanometer (3000 A) thick coating of $SiO_2:TiO_2$ and a particle size ranging from 25 to 30 micrometers) were placed in a 10 cm×10 cm vibrating aluminum tray located on the lower powered electrode of the plasma reactor. The reactor was evacuated to a pressure of less than 0.65 Pa (5 mTorr) and was at a temperature of 20° C. Butadiene gas was introduced into the chamber at a flow rate of 100 sccm and pressure of 3.51 Pa (27 mTorr). RF power of 1.3 kW and DC self-bias voltage of 600 Volts was applied to the reactor which caused plasma to form. The plasma filled the reactor and an ion sheath formed around the tray. Ions in the plasma accelerated toward and bombarded the particles. The temperature increased to between about 60° C. to about 70° C. during the deposition. The power was applied for 17 minutes. The thickness of the DLC coating was calculated to be between about 10 to 20 nanometers (100 and 200 A) based on the deposition rate data for a planar substrate wherein the deposition was conducted using similar methods. The deposition on the planar substrate was determined by the inventors by taking step-height measurements with a profilometer, which measures the profile height of a planar material.

Multiple batches of inorganic phosphor particles were coated by this method. The batches were combined and thoroughly mixed in a sieve vibrator to use for testing and to form lamps for luminance testing. Hydrophobicity and resistance to chemical attack were measured using the qualitative methods previously discussed. The DLC-coated inorganic phosphor particles were substantially more hydrophobic than the oxide-coated particles and displayed high resistance to chemical attack.

Example 2

This example illustrates the preparation of DLC-coated inorganic phosphor particles wherein the particles are placed on a quartz frit placed directly above a powered planar electrode in a parallel plate plasma reactor. A spouted bed was used to agitate the particles.

A parallel plate reactor, materially as depicted in FIG. 2, was used for the deposition of DLC. The reactor comprised a 15.2 cm inner diameter×15.2 cm high aluminum tube closed on the top by an aluminum plate having pumping ports. On the bottom of this aluminum tube was an assembly of electrode, glass frit, and plastic insulation plate. The powered electrode was connected to an RF power supply through a matching network. Acetylene gas was introduced through an inlet beneath the glass frit at a flow rate of 215 sccm. Oxide(only)-coated inorganic phosphor particles (400 grams, "Type 729") were placed onto the frit. The system was pumped down to a base pressure of 0.91 Pa (7 mTorr). With the acetylene gas flow kept constant at 215 sccm, the chamber pressure was about 32.5 Pa (250 mTorr) and the temperature was initially 20° C. The plasma self-ignited as the power was applied and increased to the sustained level of 150 Watts. DLC deposition was carried out for 10 minutes. The process yielded a DLC coating thickness estimated to be 20 to 100 nanometers (200 to 1000 A), based on the color of the particles. The thicker the DLC coating, the more yellow the phosphor particles appear. The resulting DLC-coated inorganic phosphor particles displayed similar hydrophobic and chemical resistant properties to those of the coatings produced by the method described in Example 1.

Example 3

This example illustrates the preparation of DLC-coated oxide-coated inorganic phosphor particles wherein a fluidized bed is used to agitate the particles and the plasma is sustained by means of magnetic fields (i.e., inductive coupling).

The reactor for this example comprised a 10.2 cm diameter, 61 cm long quartz tube materially as depicted in FIG. 3. The quartz tube was fitted with a quartz frit onto which was loaded about 150 grams of oxide-coated inorganic phosphor particles ("Type 729"). The tube was evacuated to a base pressure below 0.65 Pa (0.005 Torr). A two turn helical coil of 1.25 cm (0.5 in) OD copper tubing formed a solenoid which was positioned around the quartz tube and used to inductively couple 2 kW of electrical energy into the plasma. The inorganic phosphor particles were fluidized by passing argon gas through the particle bed at a pressure of 58.5 Pa (450 mTorr) and a flow rate of 250 sccm. Hydrogen gas was introduced into the chamber at a rate of 60 sccm. Methane gas was introduced into the chamber at a flow rate of 3 sccm for 25.5 hours. The fluidization zone of the particles coincided with the location of the solenoid. The inorganic phosphor particles produced by this method suffered some thermal damage, as was evidenced by their dark (blackened) color after coating. The DLC-coated inorganic phosphor particles were observed to be more hydrophobic than oxide(only)-coated inorganic phosphor particles by conducting the hydrophobicity test as described above.

Example 4

This example illustrates the preparation of DLC-coated inorganic phosphor particles wherein the particles are agitated by means of a spouted bed and the plasma is sustained by inductive coupling.

This example was carried out substantially as described in Example 3, except as stated herein, most notably butadiene, rather than methane, was used as the source of hydrocarbon, and a spouted bed, materially as depicted in FIG. 4, was used to agitate the particles. About 150 grams of inorganic phosphor particles ("Type 729") were placed on the glass frit. To produce the spouted bed and maintain fluidization, argon gas velocities of 350 to 500 sccm were used. The spouted bed was about 7.6 cm (3 inches) below the bottom surface of the solenoid once the gas flow was initiated. Butadiene was admitted to the chamber at 5 sccm. Through the experiment the process pressures ranged from 39 to 117 Pa (300 to 900 mTorr), depending on the total flow rate. Power of 2 kW was applied for 6 hours.

The thickness of the DLC coating deposited on the oxide coated inorganic phosphor particles was estimated to be about 100 nanometers (1000 A) based on the intensity of the yellow color of the particles. The resulting DLC-coated inorganic phosphor particles displayed similar properties to those of the DLC-coated particles produced by the method described in Example 1.

Example 5

This example illustrates the preparation of DLC-coated oxide-coated inorganic phosphor particles wherein the particles are agitated by means of a fluidized bed.

The equipment used to carry out this experiment is materially as depicted in FIG. 5, except a two-turn helical solenoid was used. It is similar to the description in Example 3, except a grounding strap was positioned below the two-turn solenoid around the quartz tube. The grounding strap was used to maintain an axial electric field in the quartz tube and thus increase the capacitive coupling of RF energy into the plasma. Without the grounding strap there would be only a minimal amount of stray capacitive coupling due to the distributed capacitance of the solenoid.

Multiple batches of particles ("Type 729") were coated using this method for different lengths of time, as shown in the table below. Batches having approximately the same amount of exposure time were combined and intimately mixed for luminance testing. The pressure and power were maintained at approximately 65 to 130 Pa (0.5–1.0 Torr) and 1–2 kW.

TABLE

| Sample # (hours) | Sample Size (grams) | Pressure (Pa (Torr.)) | Power | Time |
|---|---|---|---|---|
| 4a | 382 | 78(0.6) | 1 kW | 4 |
| 4b | 331 | 78(0.6) | 1 kW | 4 |
| 4c | 285 | 78(0.6) | 2 kW | 4 |
| 4d | 294 | 78(0.6) | 2 kW | 4 |
| 4e | 298 | 104(0.8) | 2 kW | 4 |
| 4f | 300 | 78(0.6) | 2 kW | 4 |
| Total Sample: 1.89 Kg. | | | | |
| 4g | 140 | 78(0.6) | 2 kW | 20 |
| 4h | 139 | 78(0.6) | 2 kW | 23 |
| 4i | 66 | 78(0.6) | 2 kW | 23 |
| 4j | 247 | 91(0.7) | 2 kW | 23 |
| 4k | 177 | 78(0.6) | 2 kW | 23 |
| 4l | 268 | 78(0.6) | 2 kW | 23 |
| 4m | 227 | 78(0.6) | 2 kW | 23 |
| 4n | 275 | 78(0.6) | 2 kW | 23 |
| 4o | 270 | 78(0.6) | 2 kW | 23 |
| 4p | 237 | 78(0.6) | 2 kW | 20 |
| Total Sample: 2.046 Kg. | | | | |

The thickness of the DLC coating deposited on the oxide-coated inorganic phosphor particles was estimated to be between 10 to 200 nanometers (100 and 2000 A). The thickness was estimated from Auger depth profiling data of DLC films deposited on planar substrates using similar process conditions. Auger depth profiling is a thin film characterization technique known in thin film technology. It is explained in Willard, Merrit, Dean, and Settle, Instrumental Methods of Analysis, p. 380 (C.B.S. Publishers and Distributors, New Dehli, India (1986)). The initial luminance versus hours, for samples prepared as described above, are shown in FIG. 6. This figure depicts four curves: Curve A refers to lamps made with the DLC-coated phosphors of this invention prepared from samples 4g through 4p (20–23 hour coatings). Curve B refers to lamps made with the DLC-coated phosphors of this invention prepared from samples 4a through 4f (4 hour coatings). Curve C refers to the control lamps prepared from oxide(only)-coated inorganic phosphor particles. Curve D refers to archival data for the control lamps prepared from oxide(only)-coated inorganic phosphor particles.

The lamps were excited with a power supply operating under the following conditions:
Voltage: 115±3 Volts AC
Frequency: 400±5 Hertz
Voltage Waveform: Sinewave
Temperature: 23±4 Degrees Celsius
Relative Humidity: 45%
Lamp Size: 7.6 cm long×3.8 cm wide (3.0 inches long× 1.5 inches wide).
Brightness, or luminosity, was measured by Radiometer over a 1 cm diameter area.

The control and coated archives were prepared by Durel Corporation, as previously explained, in the same way as the DLC coated lamps were prepared.

As the data show, the initial rates of decay in luminance, i.e., from 0 to about 1000 hours are much steeper for the oxide(only)-coated particles than for the DLC coated particles. And the decay rate for the 4 hour coated particles is steeper than for the 20–23 hour coated particles. From about 1000 hours to 3000 hours, the decay rates for all the particles are about the same. However, because of the differing initial decay rates, the absolute brightness of the DLC coated particles remains higher than that of the oxide coated particles throughout their respective lives.

Other embodiments of the invention are within the scope of the following claims.

What is claimed is:

1. A discrete inorganic phosphor particle, wherein an amorphous hydrogenated diamond-like carbon coating is on at least a portion of the particle surface, further comprising a transparent layer of one or more organic or inorganic materials between the particle surface and the diamond-like carbon coating.

2. The inorganic phosphor particle of claim 1 wherein the transparent layer comprises one or more components selected from the group consisting of polymethylmethacrylate, polysiloxane, and polyvinylidene fluoride.

3. The inorganic phosphor particle of claim 1 wherein the transparent layer comprises one or more materials selected from the group consisting of titania, a mixture of titania and silica, silica, alumina, tin oxide, zirconia, and mullite.

4. The inorganic phosphor particle of claim 1 wherein the diamond-like carbon coating substantially covers the transparent layer.

* * * * *

UNITED STATES PATENT AND TRADEMARK OFFICE
CERTIFICATE OF CORRECTION

PATENT NO. : 6,265,068 B1  
DATED : July 24, 2001  
INVENTOR(S) : Moses M. David and Dee Lynn Johnson Page 1 of 1

It is certified that error appears in the above-identified patent and that said Letters Patent is hereby corrected as shown below:

<u>Column 9,</u>  
Line 65, "0.00" should read -- 0.001 --

Signed and Sealed this

Twenty-fifth Day of December, 2001

Attest:

JAMES E. ROGAN  
*Attesting Officer*  *Director of the United States Patent and Trademark Office*